(12) United States Patent
Tanaka et al.

(10) Patent No.: US 6,835,965 B2
(45) Date of Patent: Dec. 28, 2004

(54) SEMICONDUCTOR LIGHT-EMITTING DEVICES

(75) Inventors: Mitsuhiro Tanaka, Handa (JP);
Tomohiko Shibata, Kasugai (JP);
Osamu Oda, Nishikasugai-gun (JP);
Takashi Egawa, Nagoya (JP)

(73) Assignee: NGK Insulators, Limited, Nagoya (JP)

( * ) Notice: Subject to any disclaimer, the term of this patent is extended or adjusted under 35 U.S.C. 154(b) by 34 days.

(21) Appl. No.: 10/351,390

(22) Filed: Jan. 27, 2003

(65) Prior Publication Data

US 2003/0178642 A1 Sep. 25, 2003

(30) Foreign Application Priority Data

Feb. 8, 2002 (JP) .................................... P2002-032307

(51) Int. Cl.⁷ .............................................. H01L 33/00
(52) U.S. Cl. ......................... 257/103; 257/13; 257/14; 257/22; 257/79; 257/103; 117/97
(58) Field of Search .................. 117/97; 257/79, 257/13, 14, 22, 103

(56) References Cited

U.S. PATENT DOCUMENTS 6,469,320 B2 * 10/2002 Tanabe et al. ................ 257/79
6,495,894 B2   12/2002 Shibata et al.
6,596,079 B1 *  7/2003 Vaudo et al. ................. 117/97
6,649,942 B2 * 11/2003 Hata et al. ................... 257/103
6,680,959 B2 *  1/2004 Tanabe et al. ................ 372/45
6,685,773 B2 *  2/2004 Ueta et al. ................... 117/101

FOREIGN PATENT DOCUMENTS

JP      A 2002-176196       6/2002

* cited by examiner

*Primary Examiner*—David Nelms
*Assistant Examiner*—Mai-Huong Tran
(74) *Attorney, Agent, or Firm*—Oliff & Berridge, PLC

(57) ABSTRACT

An object of the present invention is to provide a semiconductor light-emitting device that reduces dislocation density and has a high luminous efficiency. A semiconductor light-emitting device 20 has an underlayer 13 made of nitride semiconductor containing Al and a dislocation density of $10^{11}/cm^2$ or less. The device further has an n-type conductive layer 14 and p-type conductive layer 17 each composed of nitride semiconductor having an Al content smaller than that of the nitride semiconductor constituting the underlayer and having a dislocation density of $1 \times 10^{10}/cm^2$ or less. The device still further has a light emitting layer 15 composed of nitride semiconductor having an Al content smaller than that of the nitride semiconductor constituting the underlayer and having a dislocation density of $1 \times 10^{10}/m^2$ or less, as well.

17 Claims, 3 Drawing Sheets

SEMICONDUCTOR LIGHT-EMITTING DEVICES

This application claims the benefit of Japanese Patent Application P2002-32307, filed on Feb. 8, 2002, the entirety of which is incorporated by reference.

BACKGROUND OF THE INVENTION

1. Field of the Invention

The present invention relates to a semiconductor light-emitting device, particularly to a semiconductor light-emitting device using a III nitride film, which can be preferably used for a photo diode or the like.

2. Related Art Statement

The III nitride film is used as a semiconductor film that constitutes the semiconductor light-emitting device, and has been expected in recent years as a high-brightness light source for light covering from green light to blue light and a light source for ultra-violet light and white light as well.

In recent years, a so-called epitaxial substrate that includes an underlayer film formed on a substrate by epitaxial growth is often used as a substrate on which such a III nitride film is formed. Then, a III nitride layer group, in which a single layer m nitride film or a plurality of III nitride films is laminated, is formed on the epitaxial substrate by using an MOCVD method or the like. A desired semiconductor light-emitting device is thus obtained.

FIG. 1 is a structural view showing an example of a conventional so-called PIN type semiconductor light-emitting device.

In a semiconductor light-emitting device 10 shown in FIG. 1, a buffer layer 2 made of GaN, an underlayer. 3 made of Si doped n-GaN, an n-type conductive layer 4 made of Si doped n-AlGaN, a light-emitting layer 5 having a multi-quantum well (MQW) structure made of InGaN, a p-type cladding layer 6 made of Mg doped p-AlGaN, and a p-type conductive layer 7 made of Mg doped p-GaN are formed in this order on a substrate 1 mainly composed of sapphire single crystal. In the semiconductor light-emitting device 10 shown in FIG. 1, layers from the n-type conductive layer 4 to the p-type conductive layer 7 constitute a light-emitting structure.

A part of the n-type conductive layer 4 is exposed, and an n-type electrode 8 made of Al/Ti or the like is formed in the exposed portion, and a p-type electrode 9 made of Au/Ni or the like is formed on the p-type conductive layer 7.

When a predetermined voltage is applied between the n-type electrode 8 and the p-type electrode 9, recombination of carriers occurs in the light-emitting layer 5 to emit light having a predetermined wavelength. Note that the wavelength is determined by the structure, the composition or the like of the light-emitting layer.

SUMMARY OF THE MENTION

In the semiconductor light-emitting device 10 shown in FIG. 1, the buffer layer 2 serves as a buffering layer in order to complement the difference of lattice constants between the substrate 1 and the underlayer 3 to enable the underlayer 3 or the like formed above the substrate 1 to perform epitaxial growth. Therefore, the buffer layer is usually formed in an amorphous state under low temperature from 500° C. to 700° C. leaving the crystallinity out of consideration.

As a result, the buffer layer 2 contains a relatively large quantity of dislocations, and a part of the dislocations propagates as threading dislocations into the underlayer 3, n-type conductive layer 4, light-emitting layer 6, p-type cladding layer 6 and p-type conductive layer 7. This has led these layers to contain a dislocation quantity exceeding $10^{10}/cm^2$, and crystal quality has deteriorated. Particularly, the above-described tendency is conspicuous in the case of the semiconductor light-emitting device for a short wavelength, that is, the case where the n-type conductive layer 3 and the light-emitting layer 4 contain large quantities of Al.

There has existed a problem that a so-called nonradiative recombination occurred due to the dislocation in the light-emitting layer and luminous efficiency reduced when layers of low crystal quality constituted the semiconductor light-emitting device under such high dislocation density.

An object of the present invention is to provide a semiconductor light-emitting device that reduces dislocation density and has a high luminous efficiency.

The present invention provides a semiconductor light-emitting device having a substrate, an underlayer made of nitride semiconductor and a light-emitting device structure including a nitride semiconductor layer group on the underlayer. The nitride semiconductor constituting the underlayer contains at least Al and has a dislocation density of $10^{11}/cm^2$ or less. The nitride semiconductor layer group constituting the light-emitting device structure has an Al content smaller than that of the nitride semiconductor constituting the underlayer and a dislocation density of $1 \times 10^{10}/m^2$ or less.

The inventors have intensely studied for achieving the above object. The above-described deterioration of luminous efficiency occurs as a result of the high dislocation due to the low crystal quality of each layer that constitutes the semiconductor light-emitting device. The inventors have attempted to improve the crystal quality by reducing the dislocation quantity of each layer that constitutes the semiconductor light-emitting device.

As described above, the dislocation in each layer that constitutes the semiconductor light-emitting device is caused by the buffer layer of low crystal quality. Sapphire single crystal has been used for the substrate 1 and n-GaN has been used for the underlayer 3 in the conventional semiconductor light-emitting device shown in FIG. 1. Such combination has induced a problem that dislocations in the underlayer 3 propagated into the n-type conductive layer 4 when the n-type conductive layer 4 made of n-AlGaN, which is a III nitride, was formed on the underlayer 3. Particularly, cracks often occurred when Al content in n-AlGaN, which constitutes the n-type conductive layer 4, increased. When the n-type conductive layer 4 contains Al, its lattice constant is reduced, and the cracks are caused by tensile stress induced in the n-type conductive layer 4.

Consequently, the inventors have had various kinds of studies not only on the buffer layer but also on the underlayer. In the conventional semiconductor light-emitting device shown in FIG. 1, the light-emitting layer is made of nitride semiconductor having Ga as main component as it is obvious from the device construction. Therefore, it has been taken for granted that the underlayer provided for these layers was made of material having Ga series, GaN for example, as main component. This resulted in lattice mismatch with the substrate, and the buffer layer formed under low temperature has been required to mitigate the mismatch.

However, the inventors have paid attention to the composition of the underlayer, which was taken for granted, and have attempted to change the component. As a result, the inventors have thought out to constitute the underlayer of nitride semiconductor having Al as the main component of low dislocation and good crystal quality. The underlayer complements a large difference of lattice constants and can perform epitaxial growth on the substrate such as sapphire even when the buffer layer does not exist. Further, the crystal quality of the conductive layer and the light-emitting layer formed on the underlayer is also improved and the dislocation quantity of the layers are reduced due to the high crystal quality of the underlayer. As a result, the dislocation quantity in each layer, which constitutes the semiconductor light-emitting device, is reduced and nonradiative recombination based on the high dislocation quantity can be effectively restricted.

Further, the underlayer of high crystal quality of this kind has superior heat dissipation characteristic. For this reason, the synergic effect of the high crystal quality and the heat dissipation characteristic of the underlayer can improve the luminous efficiency of the semiconductor light-emitting device, and high-brightness light emission can be performed.

These and other objects, features and advantages of the invention will be appreciated upon reading the following description of the invention when taken in conjunction with the attached drawings, with the understanding that some modifications, variations and changes of the same could be made by the skilled person in the art.

PREFERRED EMBODIMENTS OF THE INVENTION

Description will be made for the present invention in detail according to the preferred embodiments.

Figure 1:
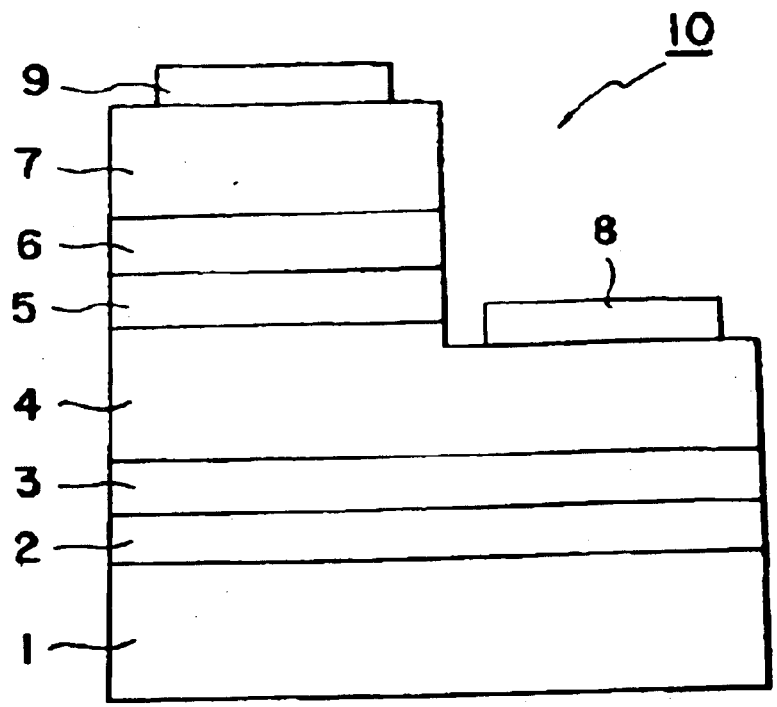
FIG. 1 is a constitutional view showing an example of the conventional semiconductor light-emitting device.
Figure 2:
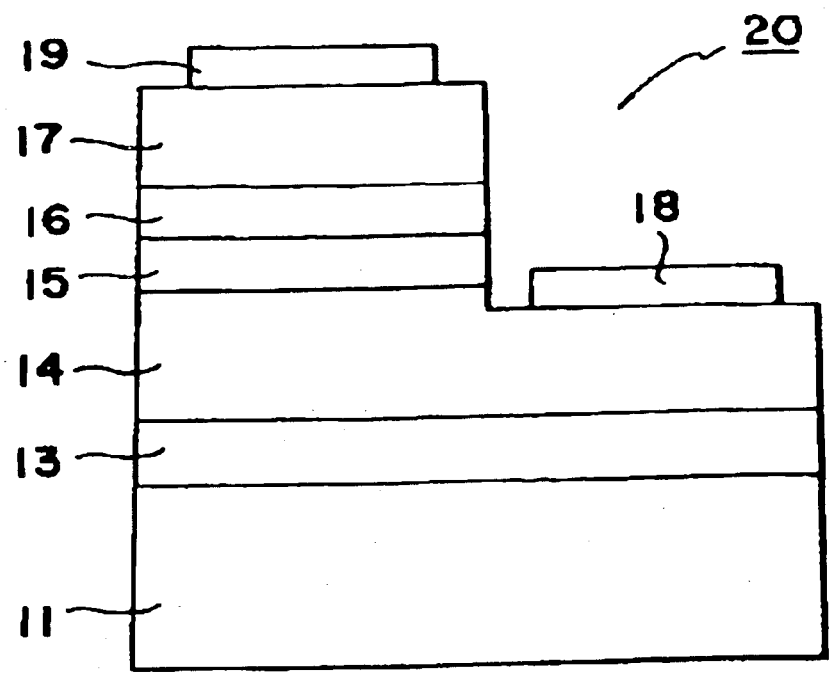
FIG. 2 is a constitutional view showing an example of the semiconductor light-emitting device of the present invention.

FIG. 2 is a constitutional view showing an example of the semiconductor light-emitting device of the present invention. A semiconductor light-emitting device 20 shown in FIG. 2 sequentially includes an underlayer 13, n type conductive layer 14, light-emitting layer 15, p-type cladding layer 16, and p-type conductive layer 17 on a substrate 11. Then, similar to the semiconductor light-emitting device 10 shown in FIG. 1, a part of the n-type conductive layer 14 is exposed. An n-type electrode 18 made of Al/Ti for example, is formed on the exposed n-type conductive layer 14, and a p-type electrode 19 made of Au/Ni, for example, is formed on the p-type conductive layer 15. A so-called PIN type semiconductor light-emitting device is thus obtained.

In FIG. 2, the n-type conductive layer 14, light-emitting layer 15, p-type cladding layer 16 and p-type conductive layer 17 constitute the nitride semiconductor layer group in the semiconductor light-emitting device. The nitride semiconductor layer group, n-type electrode 18 and p-type electrode 19 constitute the light-emitting device structure. Note that the p-type cladding layer 16 may be omitted if necessary.

The underlayer 13 needs to contain Al and be made of nitride semiconductor having a dislocation density of $10^{11}$/$cm^2$ or less according to the present invention. It is preferable that the dislocation density be $10^{10}$/$cm^2$ or less. In this case, the underlayer complements the difference of lattice constants with the substrate 11 and is capable of performing epitaxial growth spontaneously. As a result, it is possible to allow the n-type conductive layer 14, light-emitting layer 15 and p-type conductive layer 17 to perform epitaxial growth on the underlayer 13.

Further, it is necessary that the n-type conductive layer 14, light-emitting layer 15 and p-type conductive layer 17, which constitute the nitride semiconductor layer group, be made of nitride semiconductor with a smaller Al content than the underlayer 13 and has a dislocation density of $10^{10}$/$cm^2$ or less. With this constitution, the luminous efficiency of the device 20 can be improved.

This is because the ratio of the threading dislocation is reduced due to Al composition difference between the underlayer 13 and the n-type conductive layer 14. Also, the dislocation density in the n-type conductive layer 14, light-emitting layer 15 and p-type conductive layer 17 can be reduced, and thus the crystal quality of the n-type conductive layer 14 improves.

The above-described effect is conspicuous as Al content in the nitride semiconductor that constitutes the underlayer 13 becomes larger. It is preferable that the nitride semiconductor contain Al in an amount of 50 atomic percent or more based on all of the constituent III elements. Moreover, it is preferable that the nitride semiconductor be AlN.

Accordingly, when the underlayer 13 is made of the nitride semiconductor with a high Al content, the crystal quality of the n-type conductive layer 14 can be further improved. Consequently, the crystal quality of the n-type conductive layer 14, light-emitting layer 15 and p-type conductive layer 17, which have been formed on the underlayer 13, is improved, and even lower dislocation can be achieved For example, in the case where the underlayer 13 is made of AlN and the n-type conductive layer 14 directly formed on the underlayer 13 is made of AlGaN or the like, which contains a relatively large quantity of Ga, the composition difference between the underlayer 13 and the n-type conductive layer 14 increases. The dislocation quantity of the n-type conductive layer 14 can be further reduced comparing to the dislocation quantity of the underlayer 13.

Particularly when Ga content of the nitride semiconductor layer group is 80 atomic percent or more for all the constituent III elements, the dislocation density of the n-type conductive layer 14, light-emitting layer 15 and p-type conductive layer 17, which constitute the nitride semiconductor layer group, can-be easily-reduced to $1 \times 10^9$/$cm^2$ or less. It can be-further reduced to $1 \times 10^8$/$cm^2$ under the present circumstances. Note that the Ga content is an average composition in the entire nitride semiconductor layer group.

The underlayer 13 that contains Al and is made of the nitride semiconductor of a low dislocation density and high crystal quality can be obtained by an MOCVD method, for example, through controlling the deposition temperature thereof Specifically, by setting the deposition temperature to 1100° C. or more, the desired underlayer 13 made of the nitride semiconductor of high crystal quality can be easily obtained. Note that the deposition temperature in this application means the temperature of the substrate.

The n-type conductive layer 14 or the like having a low dislocation density and high crystal quality can be obtained when epitaxial growth is performed on the above-described underlayer 13 of low dislocation and high crystal quality by the MOCVD method, for example.

Note that because the underlayer 13 satisfying the above-described characteristic has superior heat dissipation characteristic, the synergic effect of the high crystal quality and the high heat dissipation characteristic further improves the luminous efficiency of the semiconductor light-emitting device 20, and high-brightness light emission can be performed.

The substrate 11 can be made of widely known substrate materials: an oxide single crystal such as sapphire single crystal, ZnO single crystal, $LiAlO_2$ single crystal, $LiGaO_2$ single crystal, $MgAl_2O_4$ single crystal and MgO single crystal; IV or IV-IV single crystal such as Si single crystal and SiC single crystal; III-V single crystal such as GaAs single crystal, AlN single crystal, GaN single crystal and AlGaN single crystal; and single crystal of a boride such as $ZrB_2$.

In the semiconductor light-emitting device shown in FIG. 2 of the present invention the conductive layers under and above the light-emitting layer 15 are n-type and p-type respectively, but they may be formed in the opposite order. In addition, although the light-emitting layer 15 can be made of single nitride semiconductor layer, it can be made of multi-layer structure such as the multi-quantum well structure.

Figure 3:
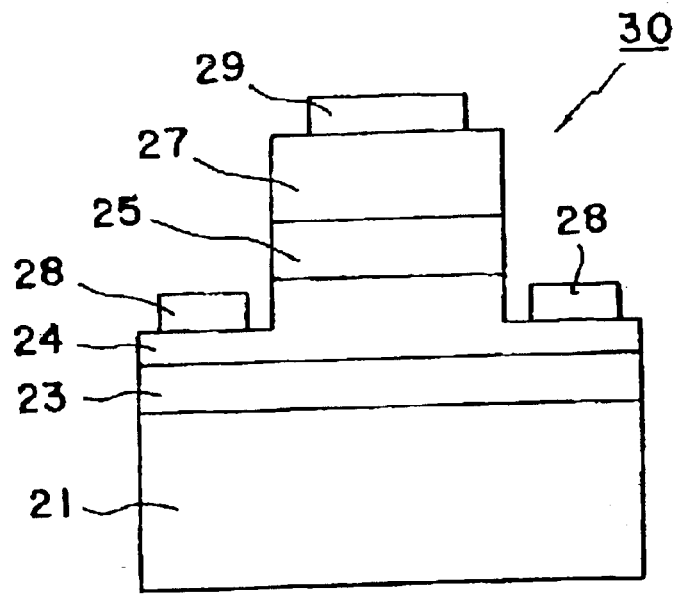
FIG. 3 is a constitutional view showing another example of the semiconductor light-emitting device of the present invention.

FIG. 3 is a constitutional view showing another example of the semiconductor light-emitting device of the present invention. A semiconductor light-emitting device 30 shown in FIG. 3 sequentially includes an underlayer 23, n-type conductive layer 24, light-emitting layer 25, and p-type conductive layer 27 on a substrate 21. Then, a part of the n-type conductive layer 24 is exposed, and an n-type electrode 28 made of Al/Ti, for example, is formed on the exposed n-type conductive layer 24 and a p-type electrode 29 made of Au/Ni, for example, is formed on the p-type conductive layer 27. A so-called ridge type laser diode is thus obtained.

In FIG. 3, the n-type conductive layer 24, the light-emitting layer 25 and the p-type conductive layer 27 constitute the nitride semiconductor layer group in the semiconductor light-emitting device. The nitride semiconductor layer group, the n-type electrode 28 and the p-type electrode 29 constitute the light-emitting device structure.

The underlayer 23 needs to contain Al and be made of nitride semiconductor having a dislocation density of $10^{11}/cm^2$ or less according to the present invention. It is preferable that the dislocation density be $10^{10}/cm^2$ or less. In this case, the underlayer complements the difference of lattice constants with the substrate 21 and is capable of performing epitaxial growth spontaneously. As a result, it is possible to allow the n-type conductive layer 24, the light-emitting layer 25 and the p-type conductive layer 27 to perform epitaxial growth on the underlayer 23.

Further, it is necessary that the n-type conductive layer 24, light-emitting layer 25 and p-type conductive layer 27, which constitute the nitride semiconductor layer group, be made of the nitride semiconductor with a smaller Al content than the underlayer 23 and a dislocation density of $10^{10}/cm^2$ or less. With this constitution, the luminous efficiency of the semiconductor light-emitting device 30 can be improved.

This is because, in this case as well, the ratio of the threading dislocation is reduced due to Al composition difference between the underlayer 23 and the n-type conductive layer 24. The dislocation densities in the n-type conductive layer 24, the light-emitting layer 25 and the p-type conductive layer 27 can be thus reduced, and the crystal quality of the n-type conductive layer 24 improves, as described above.

The above-described effect is conspicuous as Al content in the nitride semiconductor constituting the underlayer 23 becomes larger. It is preferable that the nitride semiconductor contain Al in an amount of 50 atomic percent or more based on all of the constituent III elements. Moreover, it is preferable that the nitride semiconductor be made of AlN.

Accordingly, when the underlayer 23 is made of the nitride semiconductor with a high Al content, the crystal quality of the n-type conductive layer 24 can be farther improved. Consequently, the crystal quality of the n-type conductive layer 24, the light-emitting layer 25 and the p-type conductive layer 27, which have been formed on the underlayer 23, is improved, and even lower dislocation can be achieved.

Particularly when Ga content of the nitride semiconductor layer group is 80 atomic percent or more based on all the constituent III elements, the dislocation densities of the n-type conductive layer 24, light-emitting layer 26 and p-type conductive layer 27, which constitute the nitride semiconductor layer group, can be easily reduced to $1\times10^9/cm^2$ or less. It can be farther reduced to $1\times10^8/cm^2$ under the present circumstances. Note that the Ga content is the average composition in the entire nitride semiconductor layer group.

The underlayer 23 that contains Al and is made of the nitride semiconductor of a low dislocation density and high crystal quality can be obtained by the MOCVD method, for example, through controlling the deposition temperature thereof. Specifically, by setting the deposition temperature to 1100° C. or more, the desired underlayer 23 made of the nitride semiconductor of high crystal quality can be easily obtained. Note that the deposition temperature in this application means the temperature of the substrate itself.

The n-type conductive layer 24 or the like having a low dislocation density and high crystal quality can be obtained when epitaxial growth is performed on the above-described underlayer 23 of low dislocation and high crystal quality by the MOCVD method, for example.

The underlayer 23 satisfying the above-described characteristic has superior heat dissipation characteristic as well. The synergic effect of the high crystal quality and high heat dissipation characteristic further improves the luminous efficiency of the semiconductor light-emitting device 30 to improve the brightness of the emitted light.

The substrate 21 can be made of sapphire single crystal or the like similar to the above-described substrate 11.

In the semiconductor light-emitting device shown in FIG. 3, the conductive layers under and above the light-emitting layer 25 are n-type and p-type respectively, but they may be formed in the opposite order. In addition, although the light-emitting layer 25 can be made of single nitride semiconductor layer, it can be made of multi-layer structure such as the multi-quantum well structure.

EXAMPLES

Example 1

In this example, the PIN type semiconductor light-emitting device shown in FIG. 2 was fabricated. A c-faced sapphire single crystal substrate having a diameter of 2 inches and a thickness of 500 μm was used as the substrate 11, and the substrate was installed in an MOCVD system. The MOCVD system is equipped with gas system of $H_2$, $N_2$, TMA, TMG, $Cp_2Mg$, $NH_3$ and $SiH_4$. After the pressure was set at 100 Torr, the substrate 11 was heated at 1160° C. while flowing $H_2$ in an average flow rate of 1 m/sec.

Subsequently, a predetermined quantities of TMA and $NH_3$ were supplied to the system to grow an AlN layer as the underlayer 13 up to a thickness of 1 μm. At this point, supply quantities of TMA and $NH_3$ were set such that deposition rate becomes 0.3 μm/hr. The dislocation density in the AlN layer was $8\times10^9/cm^2$ when observed by TEM (transmission electron microscope). When the x-ray rocking curve on (002) plane of AlN was measured, its full width at halfmaximum value was 100 seconds or less and the surface roughness (Ra) was 2 Å or less, and thus, good crystal quality was confirmed.

After setting the substrate temperature at 1120° C., the pressure was returned to atmospheric pressure, an Si doped n-GaN layer was grown in a thickness of 3 μm as the n-type conductive layer 14 while flowing TMA, $NH_3$ and $SiH_4$ in a total gas average flow rate of 1 m/sec. The material supply quantity was set such that the deposition rate became 3 μm/hr. Note that $SiH_4$ was supplied such that the carrier concentration became $5\times10^{17}/cm^3$.

Next, after supply of each material gas was terminated and carrier gas was changed to nitrogen, the substrate temperature was set to 700° C. TMI, TMG and $NH_3$ were flown on the n-GaN layer with a total gas average flow rate of 1 m/sec, and an i-InGaN layer as the light-emitting layer 15 was formed as the MQW structure. Then, TMI was switched to TMA and $Cp_2Mg$ was supplied such that the carrier concentration became $2\times10^{17}/cm^3$, and a p-AlGaN layer as the p-type cladding layer 16 was grown in the thickness of 20 nm. Subsequently, TMG, $NH_3$ and $Cp_2Mg$ were supplied after supply of TMA was terminated and the substrate temperature was increased to 1000° C., an Mg doped p-GaN layer as the p-type conductive layer 17 was formed in the thickness of 0.2 μm.

The dislocation density in the n-GaN layer, the i-InGaN layer and the p-GaN layer was $5\times10^7/cm^2$, $5\times10^7/cm^2$ and $5\times10^7/cm^2$ respectively when observed by TEM.

Moreover, each layer was partially removed by etching to expose a part of the n-GaN layer constituting the n-type conductive layer 14, and the n-type electrode 18 made of Al/Ti was formed on the exposed portion. Further, the p-type electrode 19 made of Au/Ni was formed on the p-GaN layer that constituting the p-type conductive layer 17.

Comparative Example 1

In this comparative example, the PIN type semiconductor light-emitting device shown in FIG. 1 was fabricated. A sapphire single crystal substrate as the substrate 1 was used, and the substrate was installed in the same MOCGVD system as the example 1. After heating the substrate to 600° C., TMG and $NH_3$ were supplied, and a GaN layer as the buffer layer 2 was formed in the thickness of 0.03 μm.

Subsequently, supply of TMG and $NH_3$ was temporarily terminated and the substrate temperature was set at 1120° C., TMG, $NH_3$ and $SiH_4$ were supplied, and thus the n-GaN layer as the underlayer 3 was formed in a thickness of 3 μm at the deposition rate of 3 μm/hr. Next, the layers from the n-type conductive layer 4 to the p-type conductive layer 7 were formed in the same manner as the example 1, the n-type electrode 8 made of Al/Ti and p-type electrode 9 made of Au/Ni were formed. The semiconductor light-emitting device 10 was thus fabricated.

The dislocation densities in the n-GaN layer, the i-InGaN layer and the p-GaN layer, which respectively constitute the n-type conductive layer 4, the light-emitting layer 5 and the p-type conductive layer 7, were $2\times10^{10}/cm^2$, $2\times10^{10}/cm^2$ and $2\times10^9/cm^2$ respectively when measured by TEM observation.

Figure 4:
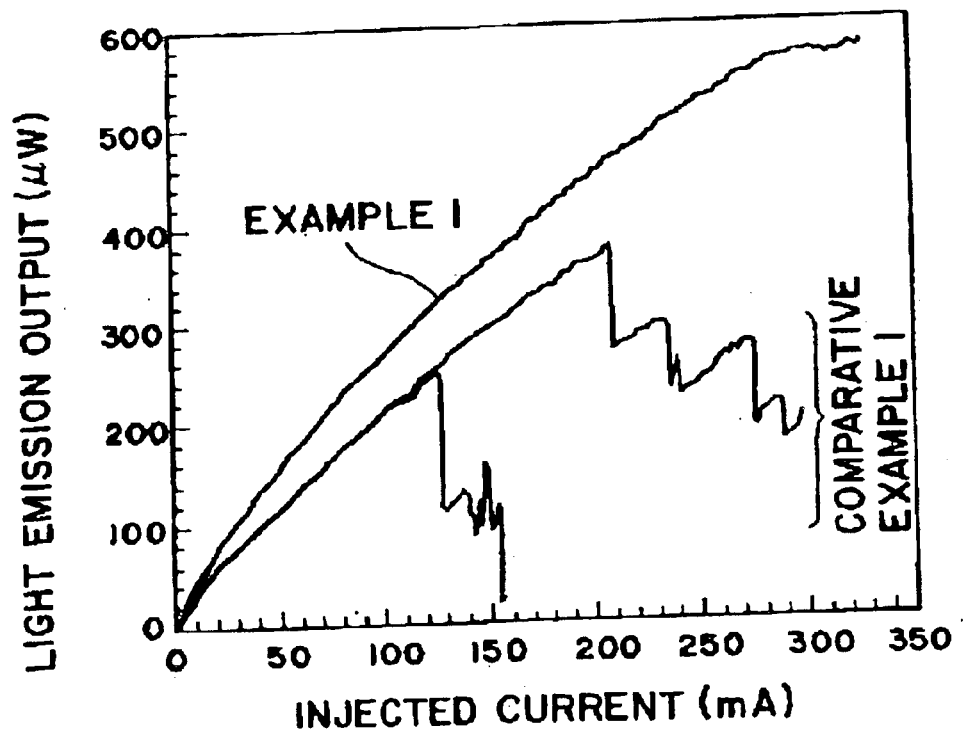
FIG. 4 is a graph showing the light emission characteristic of the semiconductor light-emitting device.

FIG. 4 is a graph showing light emission characteristics of the semiconductor light-emitting devices manufactured in the above-described Example 1 and Comparative Example 1. FIG. 4 shows the relationship between injected current into the semiconductor light-emitting device and light emission output. As it is obvious from FIG. 4, the semiconductor light-emitting device obtained in Example 1 shows larger light emission output for a predetermined injected current than the semiconductor light-emitting device obtained in Comparative Example 1.

Further, in the semiconductor light-emitting device obtained in Example 1, the light emission output increases as the injected current increases and the element shows high light emission output in a high injected current region. On the other hand, in the semiconductor light-emitting device obtained in Comparative Example 1, the element is broken in the high injected current region and the light emission characteristic deteriorates accordingly.

Example 2

In this example, a simplified element of the ridge type laser diode shown in FIG. 3 was fabricated. Specifically, the underlayer 23 was made to serve as the light-emitting layer without forming the light-emitting layer 25, p-type conductive layer 27, n-type electrode 28 and p-type electrode 29, and induced emission was executed using a predetermined pumping light.

The c-faced sapphire single crystal substrate having a diameter of 2 inches and a thickness of 500 μm was used as the substrate 21, and the substrate was installed in the MOCVD system. The MOCVD system is attached with gas system of $H_2$, $N_2$, TMA, TMG, $Cp_2Mg$, $NH_3$ and $SiH_4$. After the pressure was set at 100 Torr, the substrate 21 was heated at 1150° C. while flowing $H_2$ in the average flow rate of 1 m/sec.

Subsequently, predetermined quantities of TMA and $NH_3$ were supplied to the system to grow an AlN layer as the underlayer 23 up to the thickness of 1 μm. At this point, the supply quantities of TMA and $NH_3$ were set such that the deposition rate became 0.3 m/hr. The dislocation density in the AlN layer was $8\times10^9/cm^2$ when observed by TEM. When the x-ray rocking curve on (002) plane of AlN was measured, its half-width was 100 seconds or less and the surface roughness (Ra) was 2 Å or less, and thus, good crystal quality was confirmed.

Next, after setting the substrate temperature at 1120° C., the pressure was returned to atmospheric pressure, the Si doped n-GaN layer was grown in a thickness of 3 μm as the n-type conductive layer 24 while flowing TMG, $NH_3$ and $SiH_4$ in a total gas average flow rate of 1 m/sec. The material supply quantity was set such that the deposition rate became 3 μm/hr. Note that $SiH_4$ was supplied such that carrier concentration became $1.1\times10^{17}/cm^3$.

Subsequently, the assembly fabricated as described above is cleaved in a length of 3000 μm, and the ridge type laser diode having a width of 500 μm was fabricated. The dislocation density in the n-GaN layer was $5\times10^7/cm^2$ when observed by TEM.

Comparative Example 2

In this comparative example, the ridge type laser diode was fabricated according, to the same process as the Example 2. However, the substrate 21 was heated at 600° C., TMG and $NH_3$ were supplied, and thus the GaN layer having the thickness of 0.03 μm as the buffer layer was provided on the substrate 21. At this stage, the dislocation density in the n-GaN layer formed on the buffer layer was $2\times10^{10}/cm^2$ when observed by TEM.

Figure 5:
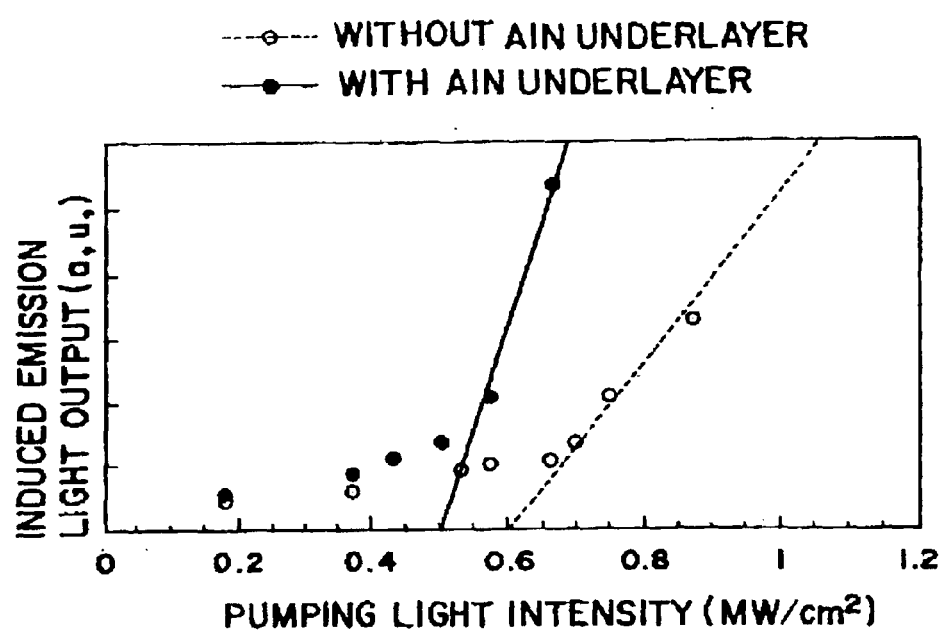
FIG. 5 is a graph showing the relationship between the induced emission output from a ridge type GaN film and the pumping light intensity.

When the relationship between induced emission light output of the laser diodes obtained in Example 2 and Comparative Example 2 and pumping light intensity was studied, and the result shown in FIG. 5 was obtained. In the laser diode shown in Example 2, which was obtained in the present invention, the induced emission occurred at a pumping light intensity of 0.5 $MW/cm^2$. On the other hand, in the laser diode having the low temperature buffer layer shown in Comparative Example 2, it was confirmed that the induced emission had occurred at a pumping light intensity of 0.6 $MW/cm^2$. In other words, a threshold value at which the induced emission occurs was reduced and excitation efficiency was confirmed to be larger in the laser diode in Example 2, which was obtained in the present invention.

As it is obvious from the above-described examples and comparative examples, in the semiconductor light-emitting device fabricated in the present invention, the crystal quality of each layer has been improved as well due to the high crystal quality of the underlayer. The synergic effect of the reduced dislocation quantity and improved heat dissipation characteristic of the AlN underlayer has improved the luminous efficiency and the excitation efficiency. The high-brightness light emission may be thus realized. Therefore, it has been confirmed that the semiconductor light-emitting device shown in the examples has higher efficiency- comparing- to-the semiconductor light-emitting device shown in the comparative examples and capable of performing high-brightness light emission.

Although the present invention has been described in detail with reference to the embodiments, the present invention is not limited to the above contents and any kind of variation and modification may be made without departing from the scope of the present invention.

For example, nitriding treatment may be applied to the substrate or pre-treatment by III material may be performed to the substrate. Further, it is possible that the composition of the underlayer is continuously changed or deposition conditions are changed in steps. Moreover, in order to further improve the crystallinity of the conductive layer, or the light-emitting layer, it is possible to insert the buffer layer or a multi-layer lamination structure such as a distorted superlattice by changing growth conditions such as temperature, flow rate, pressure, material supply quantity and additive gas. Further, n-AlGaN cladding may be inserted under the light-emitting layer, which is on the n-type conductive layer. Deposition of each layer does not need to be performed in the same deposition system, but different systems may be used.

Further, the above-described underlayer may contain an additive element such as Ge, Si, Mg, Zn, Be, P and B. Moreover, not limited to the element added intentionally, the underlayer may contain a minute element, which is inevitably taken in depending on the deposition conditions or the like, material, minute impurities that reactor material contains.

Further, the semiconductor light-emitting device can be used not only as the above-described PIN type semiconductor light-emitting device but also as any type of semiconductor light-emitting device.

As described above, in the semiconductor light-emitting device of the present invention, the underlayer is made of nitride semiconductor containing Al and has a low dislocation density and high crystal quality. The underlayer thus complements the difference of lattice constants with the substrate to enable the conductive layer or light-emitting layer to perform epitaxial growth without the need of the conventional buffer layer. Moreover, the device improves the crystallinity of the conductive layer, and the light-emitting layer or the like based on the high crystal quality of the underlayer, and thus achieves a low dislocation.

As a result, because the semiconductor light-emitting device of the present invention includes the light-emitting device structure constituted by the nitride semiconductor layer group of low dislocation density, luminous efficiency can he improved in a practical use.

What is claimed is:

1. A semiconductor light-emitting device comprising a substrate, an underlayer made of nitride semiconductor and a light-emitting device structure including a nitride semiconductor layer group on said underlayer, wherein said nitride semiconductor constituting said underlayer contains at least Al and has a dislocation density of $10^{11}/cm^2$ or less, and said nitride semiconductor layer group constituting said light-emitting device structure has an Al content smaller than that of said nitride semiconductor constituting said underlayer and a dislocation density of $1\times10^{10}/cm^2$ or less.

2. The device of claim 1, wherein said nitride semiconductor constituting said underlayer has an Al content of not lower than 50 atomic percent based on all of III elements.

3. The device of claim 2, wherein said nitride semiconductor constituting said underlayer is AlN.

4. The device of claim 1, wherein said nitride semiconductor constituting said underlayer is formed by a MOCVD method at temperature of 1100° C. or more.

5. The device of claim 1, wherein said nitride semiconductor layer group constituting said light-emitting device structure has a Ga content of 80 atomic percent or more based on all of III elements.

6. The device of claim 1, wherein said nitride semiconductor layer group constituting said light-emitting device structure includes an n-type conductive layer, a p-type conductive layer and a light-emitting layer, and said light-emitting layer is positioned between said n-type conductive layer and said p-type conductive layer.

7. The device of claim 1, wherein said substrate comprises an oxide single crystal.

8. The device of claim 1, wherein said substrate comprises one of:

sapphire single crystal;

ZnO single crystal;

$LiAlO_2$ single crystal;

$LiGaO_2$ single crystal;

$MgAl_2O_4$ single crystal; and

MgO single crystal.

9. The device of claim 1, wherein said substrate comprises IV single crystal.

10. The device of claim 1, wherein said substrate comprises IV—IV single crystal.

11. The device of claim 1, wherein said substrate is comprises IV or IV—IV single crystal selected from a group that includes:

Si single crystal; and

SiC single crystal.

12. The device of claim 1, wherein said substrate comprises III–V single crystal.

13. The device of claim 1, wherein said substrate comprises GaAs single crystal.

14. The device of claim 1, wherein said substrate comprises III–V nitride single crystal.

15. The device of claim 1, wherein said substrate comprises III–V nitride single crystal selected from a group that includes:

AlN single crystal;

GaN single crystal; and

AlGaN single crystal.

16. The device of claim 1, wherein said substrate comprises boride single crystal.

17. The device of claim 1, wherein said substrate comprises $ZrB_2$ single crystal.

* * * * *